United States Patent [19]

Haisma et al.

[11] Patent Number: 5,028,558
[45] Date of Patent: Jul. 2, 1991

[54] METHOD OF MANUFACTURING A SILICON ON INSULATOR SEMICONDUCTOR

[75] Inventors: Jan Haisma; Cornelis L. Adema; Johan G. De Bruin; Theodorus M. Michielsen; Gijsbertus A. C. M. Spierings, all of Eindhoven, Netherlands

[73] Assignee: U.S. Philips Corporation, N.Y.

[21] Appl. No.: 336,170

[22] Filed: Apr. 11, 1989

[30] Foreign Application Priority Data

Apr. 13, 1988 [NL] Netherlands ................. 8800953

[51] Int. Cl.$^5$ ............................. H01L 21/76
[52] U.S. Cl. ................................. 437/62; 437/922; 437/225; 437/974; 148/DIG. 12
[58] Field of Search ............. 437/62, 225, 238, 86, 437/241, 242, 243, 915, 925, 938, 946, 974, 979, 922; 156/629, 630, 631, 662; 148/DIG. 12

[56] References Cited

U.S. PATENT DOCUMENTS

| | | | |
|---|---|---|---|
| 3,922,393 | 11/1975 | Sears, Jr. | 427/215 |
| 4,004,046 | 1/1977 | Price | 437/228 |
| 4,050,979 | 9/1977 | Smeltzer et al. | 437/974 |
| 4,321,747 | 3/1982 | Takemura et al. | 437/2 |
| 4,601,779 | 7/1986 | Abernathy et al. | 437/228 |
| 4,649,627 | 3/1987 | Abernathy et al. | 437/915 |
| 4,735,679 | 4/1988 | Lasky | 437/233 |
| 4,826,787 | 5/1989 | Muto et al. | 437/247 |
| 4,851,078 | 7/1989 | Short et al. | 437/62 |
| 4,851,366 | 7/1989 | Blanchard | 437/228 |
| 4,897,362 | 1/1990 | Delgado et al. | 437/86 |
| 4,971,925 | 11/1990 | Alexander et al. | 437/62 |

FOREIGN PATENT DOCUMENTS

| | | |
|---|---|---|
| 0103085 | 3/1984 | European Pat. Off. |
| 0209173 | 1/1987 | European Pat. Off. |
| 1577469 | 5/1970 | Fed. Rep. of Germany |
| 57216424 | 6/1984 | Japan |

Primary Examiner—Olik Chaudhuri
Assistant Examiner—David E. Graybill
Attorney, Agent, or Firm—Paul R. Miller

[57] ABSTRACT

A method of manufacturing a silicon-on-insulator semiconductor body is characterized by the steps consisting in that a carrier body is temporarily connected to a supporting body with accurately flat and parallel major surfaces and having a thickness of at least ⅛ of the largest dimension of the carrier body, in that the free major surface of the carrier body is mechanically polished to a precision of at least ½ μm flatness, in that the carrier body is detached from the supporting body and the polished major surface is temporarily connected to the supporting body and the other major surface of the carrier body is mechanically polished to a precision of at least ½ μm flatness and a parallelism between the major surfaces of at least ½ μm whereupon a semiconductor body is connected through a major surface permanently to a major surface of the carrier body, in that then the semiconductor body is mechanically ground to a thickness of at least 50 μm larger than the desired ultimate layer thickness and is then alternately polished tribochemically and mechanically to a thickness of about 10 μm larger than the ultimately desired layer thickness, and in that there is ultimately polished tribochemically until the desired layer thickness of the semiconductor body is attained.

6 Claims, 1 Drawing Sheet

METHOD OF MANUFACTURING A SILICON ON INSULATOR SEMICONDUCTOR

The invention relates to a method of manufacturing a semiconductor body comprising at least a disk-shaped carrier body and a disk-shaped monocrystalline semiconductor body, in which at least one major surface of both bodies is made flat and optically smooth the flat major surfaces of these two bodies being brought into contact with each other in order to obtain a permanent connection, whereupon the semiconductor body is reduced in thickness.

Such a method is known from the European Patent Application 209173 published on Jan. 21, 1987.

The invention has inter alia for its object to obtain monocrystalline layers on an insulator, especially the construction designated as SOI (Silicon On Insulator). Semiconductor layers on an insulator become of increasing interest in the semiconductor technique. With SOI, in fact thin semiconductor layers can be used very advantageously to obtain semiconductor devices of very high performance. This performance is due inter alia to the fact that disturbances in the carrier under this layer, for example owing to external radiation, do not influence the operation of a semiconductor device, which would be the case, however, if the semiconductor body itself acts as a carrier. (SOI is resistant to radiation.) With thin semiconductor layers, no circulation currents occur either around semiconductor devices provided in these layers ("latch-up").

The method disclosed in European Patent Application 209173 generally yields favourable results. However, there is an increasing need to obtain in the case of silicon-on-insulator a semiconductor layer with a submicron precision as to flatness and parallelism of the major surfaces of the layer. Attempts are further made to obtain a fully uniform layer thickness of accurately defined value.

Two kinds of processing techniques are commonly used for flattening and smoothing a semiconductor body.

A first technique is purely mechanical (grinding or polishing with loose grain), in which a high precision can be attained with regard to flatness, smoothness and parallelism. With this technique, which is suitable for submicron precision, surface damage and crystal disturbance under the surface cannot be avoided, however. For the semiconductor body, in which integrated circuits have to be formed, these damages and crystal disturbances are inadmissible.

A second method of flattening and smoothing a semiconductor wafer is a tribochemical or mechanochemical technique. In this method, a surface free of damage is obtained and no crystal disturbances occur under the surface. The geometric precision is comparatively low in this technique, however; deviations on micron scale occur.

The invention has for its object to provide a method in which an extremely high geometric accuracy is obtained, especially with regard to the flatness and parallelism of the major surfaces of the semiconductor layer (submicron precision) and in which the surface is free of damage and crystal disturbances in the semiconductor layer are avoided.

The method of the kind mentioned in the opening paragraph is for this purpose characterized in that the carrier body is temporarily connected to a supporting body having accurately flat and parallel major surfaces and having a thickness of at least ⅓ of the largest dimension of the carrier body, in that the free major surface of the carrier body is mechanically polished to a precision of at least ½ μm flatness, in that the carrier body is detached from the supporting body and the polished major surface is temporarily connected to the supporting body, in that the other major surface of the carrier body is mechanically polished to a precision of at least ½ μm flatness and a parallelism between the major surfaces of at least ½ μm (maximum thickness deviation between the major surfaces), in that, after the semiconductor body has been permanently connected through a major surface to a major surface of the carrier body, the semiconductor body is mechanically ground to a thickness of at least 50 μm larger than the desired ultimate layer thickness, in that the semiconductor body is then alternately mechanically polished and tribochemically polished with as a last step a mechanical polishing step to a thickness of about 10 μm larger than the ultimately desired layer thickness, and in that a further tribochemical polishing step is carried out until the desired layer thickness of the semiconductor body is attained.

The use of the supporting body with a sufficient thickness renders it possible that a high geometric precision of flatness and of parallelism of the major surfaces of the carrier body can be attained. Due to the mechanical polishing with loose grain, a high accuracy to size and shape is obtained. The occurrence of any crystal disturbances under the surface is not detrimental to the function of the carrier body if there is a stress equilibrium in the wafer, which can be obtained in that both major surfaces are subjected to the same operation so that warp is avoided.

After the semiconductor body has been permanently connected to the carrier body, the semiconductor body is reduced in thickness. By the use of the method according to the invention, a high geometric precision is obtained. This high precision is mainly attained by the mechanical grinding and polishing steps. By means of the tribochemical polishing step, any crystal disturbances are eliminated substantially without the precision being lost. The combination of these techniques leads to an optimum geometric precision and to a surface free of disturbances, the ultimate semiconductor layer having an extremely uniform thickness.

BRIEF DESCRIPTION OF THE FIGURES

This embodiment and further embodiments of the invention will be described more fully with reference to an example shown in the drawing. In the drawing.

DETAILED DESCRIPTION OF THE INVENTION

Figure 1:
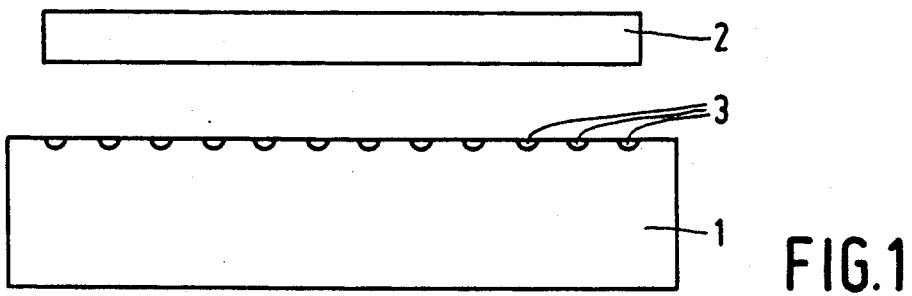
FIG. 1 is an elevation of the supporting body and the carrier body before the carrier body is secured.

FIG. 1 shows a supporting body 1, on which a carrier body 2 is secured for further processing. The supporting body 1 preferably consists of quartz glass. It is available in forms with a high geometric precision. The major surfaces are very accurately parallel and are perfectly flat. The thickness of the supporting body 1 is at least ⅛ of the largest dimension of the carrier body 2; the carrier body is mostly formed as a cylindrical disk. Due to the comparatively large thickness of the supporting body, its shape will not be liable to change during processing steps on the carrier body 2.

The carrier body 2 is preferably connected to the supporting body by means of a cement. If grooves 3 of small depth are provided in the supporting body, the major part of the cement will be introduced into the grooves 3 when the carrier body is pressed onto the supporting body. The cement, which may consist, for example, of beeswax with a filler ($Al_2O_3$ or $CaCo_3$), can be applied in the hot state. Upon cooling, the cement shrinks and pulls the carrier body firmly against the supporting body. If required, the carrier body is kept under a certain pressure during cooling of the cement.

The carrier body may also be connected to the supporting body in a different manner. For example, the upper surface of the supporting body may be provided with an annular groove, whose diameter is slightly smaller than the diameter of the carrier body and whose perpendicular section is only a few microns. Through an inner duct in the supporting body, a vacuum may be drawn in the annular groove.

The carrier body 2 may consist of a commercially available semiconductor wafer having one or two polished major surfaces. The flatness of these wafers does not satisfy the requirements for microprecision and for the parallelism of the major surfaces.

Figure 2:
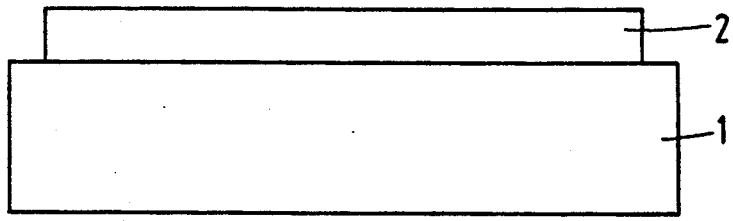
FIG. 2 is an elevation of the carrier body secured to the supporting body.

A first step in the method according to the invention consists in obtaining a carrier body 2 having perfectly smooth and flat major surfaces, which are further perfectly parallel to each other. The carrier body 2 is secured by one of its major surfaces to the supporting body, for example in the manner indicated above, as shown in FIG. 2. Subsequently, the other major surface is mechanically polished. This step of mechanical polishing is effected, for example, by means of alpha-$Al_2O_3$ powder in water on a polishing substratum consisting of pitch. The grain size of the alpha-$Al_2O_3$ powder may be 0.3 $\mu$m during this prepolishing step. Afterpolishing may be effected with beta-$Al_2O_3$ powder having a grain size of 0.05 $\mu$m. About 10 to 25 $\mu$m is polished; the polished major surface is now perfectly parallel to the supporting surface.

After the carrier body has been detached from the supporting body, the polished major surface is secured to the supporting body and the other major surface is polished in a similar manner. After this processing step, a carrier body is obtained having parallel major surfaces; the deviation in thickness is less than ½ $\mu$m, viewed over the whole carrier body, which has, for example, a diameter of 10 cm. The smoothness is such that deviations from the average value are smaller than 50 A.

Figure 3:
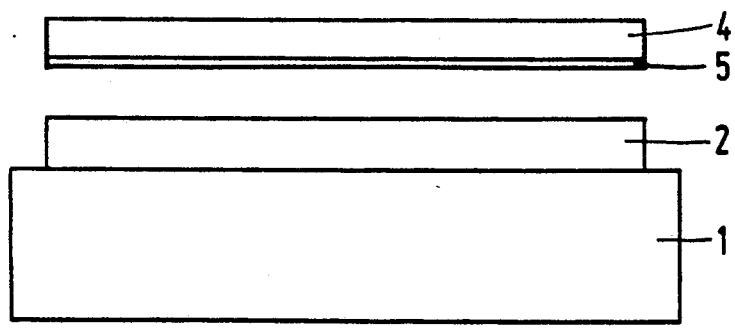
FIG. 3 shows the supporting body with the processed carrier body secured thereto, above which the semiconductor body not yet processed is shown.

FIG. 3 shows the supporting body 1 and the carrier body 2 connected thereto and the semiconductor body 4 above it, in this case provided with a thin layer 5 of silicon oxide. The thickness of the semiconductor wafer is generally 525 $\mu$m with a diameter of 10 cm. The oxide layer may have a thickness of 1 $\mu$m. The semiconductor wafer 4 is connected through its major surface provided with oxide rigidly to the carrier body. The major surfaces to be interconnected must then be perfectly clean and free of dust. The major surfaces are preferably interconnected by means of wringing. This is a van der Waals bond, which is produced by dipole forces of both surfaces. An example is described in EP 209173.

The semiconductor wafer 4 must now be reduced in thickness, i.e. to a small value which must be very accurately the same throughout this wafer. No crystal disturbances must then occur under the ultimate surface. There can be started by mechanical grinding to a thickness of, for example, 50 $\mu$m. A surface is then obtained which satisfies a high geometric precision. The step of mechanical grinding is effected, in order to obtain this high accuracy, with, for example, silicon carbide grains in an aqueous solution. At this stage, defects are present under the surface; crystal disturbances exist, whose depth depends upon the grain used. This depth may even be up to 25 $\mu$m.

In a next step, the surface damage is polished away by means of tribochemical polishing. The step of tribochemical etching is effected, for example, by means of $SiO_2$ grains having an average grain size of 30 nm in an NaOH solution having an acidity between 10 and 11. The polishing pressure may be, for example, 300–500 g/cm². After the damage depth has approximately been polished away, a thickness of, for example, 25 $\mu$m is attained. The surface is now free of damage, but the geometric precision has deteriorated. The deviation of the parallelism is now, for example, 1 $\mu$m or even slightly more.

Subsequently, the surface is mechanically processed again, but now a polishing method is used with the smallest surface damage. The damage depth is then at most 5 $\mu$m. This fine polishing can be effected with polishing powder $Al_2O_3$ having a grain size of 0.05 $\mu$m in aqueous solution. As substratum a polishing chemotextile, for example known under the trademark PAN-W, may be used; a pressure of 100–150 g/cm² is used and there is preferably worked rotatively on a double-eccentric polishing machine with a rotation difference of 25%. This fine polishing, by which again a very high geometric precision is attained, can be continued until the thickness of the semiconductor wafer is about 10 $\mu$m.

The last polishing step is carried out tribochemically in a similar manner as described above, now down to a thickness of the semiconductor layer of, for example, 5 $\mu$m. Due to the fact that only a small quantity of material is removed, the geometric precision is substantially not influenced any longer.

It is in principle not important which polishing step there is started. The mechanical steps provide for a high geometric precision; the last polishing step is a tribochemical step, in which the surface damage is entirely eliminated.

Figure 4:
FIG. 4 shows the detached carrier disk with the semiconductor layer permanently secured thereto.

The carrier with the thin semiconductor wafer is now detached from the supporting body. An assembly of components is now obtained (cf. FIG. 4) comprising a semiconductor body, in which integrated circuits in silicon on insulator can be manufactured. For the sake of clarity, the dimensions of thickness are not drawn to scale.

By way of example, the semiconductor layer was processed down to a thickness of 5 $\mu$m. It is also possible to attain very accurately a smaller layer thickness. For this purpose, first an accurate thickness measurement is carried out on the layer (which is about 5 $\mu$m thick). Subsequently, the surface is thermally oxidized for a time to be determined. The silicon oxide formed is then removed by an etching process (for example in a HF solution), by which an exactly prescribed thickness of the semiconductor layer can be obtained.

Variations of the embodiment described are possible, in which the inventive idea is maintained. The thickness of the supporting body is at least ⅛ of the diameter of the supporting body. In practice a ratio ¼ has proved very satisfactory. The carrier body is temporarily secured preferably in the manner shown, but, if desired, this may also be effected in a different way.

In deviation from what has been described above, the semiconductor body may also be permanently secured to the carrier body with the carrier body detached from the supporting body. The wringing step can then be more readily mechanized. The combination must then be connected again to the supporting body, however, in order to reduce the thickness of the semiconductor wafer. The accuracy of repositioning on the supporting body must then be high.

The carrier body 2 may consist, for example, of quartz glass. It is also favourable to use a carrier body of silicon, preferably monocrystalline silicon. The carrier body as well as the semiconductor body may be doped, any desired doping being possible, while the doping may be of the same type and of opposite type (p and n).

An example of use is shown in "L'Onde Electrique", the article "Solid Stage Image Sensors for Electronic Read-Out of Image Tubes", November 1987, Vol. 67, pp. 99–107, see the Electronic Mode shown in FIG. 3. The embodiment shown therein can be advantageously manufactured in the manner described hereinbefore.

The semiconductor body may have functionally different properties, for example electrical, but also optical (laser) or opto-electrical properties.

The carrier body has a very high geometric precision due to the mechanical polishing process. If desired, the damage depth on the carrier body caused by this polishing process may be eliminated by means of a tribochemical operation.

The carrier body may consist of material having specific properties, for example, magnetic, magneto-optical, photorefractive, piezo-electrical or opto-electrical properties.

Between the carrier body and the semiconductor body, a chemical barrier may then be desirable. This barrier may be constituted, for example, by a silicon nitride layer, which is embedded between two silicon oxide layers.

The semiconductor body may already by provided with active electronic elements. A major surface may be planarized in such a manner that wringing onto the carrier body is possible. The method of the kind described may also be used in such cases if the planarized major surface provided with active elements is connected to the major surface of the carrier body.

We claim:

1. A method of manufacturing a semiconductor body comprising at least a disk-shaped carrier body and a disk-shaped monocrystalline semiconductor body, in which at least one major surface of both bodies is made flat and optically smooth, the flat major surfaces of these two bodies being brought into contact with each other in order to obtain a permanent connection, whereupon the semiconductor body is reduced in thickness, characterized in that the carrier body is temporarily connected to a supporting body, which has accurately flat and parallel major surfaces and whose thickness is at least ⅛ of the largest dimension of the carrier body, in that the free major surface of the carrier body is mechanically polished to a precision of at least ½ μm flatness, in that the carrier body is detached from the supporting body and the polished major surface is temporarily connected to the supporting body, in that the other major surface of the carrier body is mechanically polished to a precision of at least ½ μm flatness and a parallelism between the major surfaces of the carrier body of at least ½ μm, in that, after the semiconductor body, has been permanently connected through a major surface to a major surface of the carrier body, the semiconductor body is mechanically ground to a thickness of at least 50 μm larger than the desired ultimate layer thickness, of the semiconductor in that body the semiconductor body is then alternately polished tribochemically and polished mechanically to a thickness of about 10 μm larger than the ultimately desired layer thickness, and in that the semiconductor body is then polished tribochemically until the desired layer thickness of the semiconductor body is attained.

2. A method as claimed in claim 1, characterized in that the thickness of the semiconductor body layer is further reduced in that, after the thin semiconductor body layer thickness has been measured, said semiconductor body layer is thermally oxidized, whereupon the thermal oxide is selectively etched away.

3. A method as claimed in claim 1 or 2, characterized in that the supporting body is made of quartz, and in that the carrier body is made of a material having semiconductor, magnetic, piezo-electrical, photorefractive or electro-optical properties or a combination of these properties.

4. A method as claimed in claim 3, characterized in that the monocrystalline semiconductor body is provided at the major surface to be connected to the carrier body with a silicon oxide layer, then with a silicon nitride layer and finally with a silicon oxide layer.

5. A method as claimed in claim 1 or 2, characterized in that the supporting body is made of quartz, in that the carrier body is made of quartz and in that the monocrystalline semiconductor body is provided at the major surface to be connected to the carrier body with a silicon oxide layer.

6. A method as claimed in claim 1 or 2, characterized in that the supporting body is made of quartz, in that the carrier body is made of an optically transparent material and in that the semiconductor body, before being connected, is provided on the side of the major surface to be connected with active semiconductor elements and the major surface is planarized.

* * * * *